United States Patent
Yu et al.

(10) Patent No.: US 10,388,792 B2
(45) Date of Patent: *Aug. 20, 2019

(54) FINFET WITH ROUNDED SOURCE/DRAIN PROFILE

(71) Applicant: Taiwan Semiconductor Manufacturing Company, Ltd., Hsinchu (TW)

(72) Inventors: Ming-Hua Yu, Hsinchu (TW); Chih-Pin Tsao, Zhubei (TW); Pei-Ren Jeng, Chu-Bei (TW); Tze-Liang Lee, Hsinchu (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 15 days.

This patent is subject to a terminal disclaimer.

(21) Appl. No.: 15/822,937

(22) Filed: Nov. 27, 2017

(65) Prior Publication Data
US 2018/0090608 A1    Mar. 29, 2018

Related U.S. Application Data

(63) Continuation of application No. 13/792,475, filed on Mar. 11, 2013, now Pat. No. 9,831,345.

(51) Int. Cl.
*H01L 29/78* (2006.01)
*H01L 29/66* (2006.01)

(52) U.S. Cl.
CPC ...... *H01L 29/785* (2013.01); *H01L 29/66477* (2013.01); *H01L 29/66795* (2013.01)

(58) Field of Classification Search
None
See application file for complete search history.

(56) References Cited

U.S. PATENT DOCUMENTS

| 7,078,285 | B1 | 7/2006 | Suenaga |
| 8,264,021 | B2 | 9/2012 | Lai et al. |
| 9,831,345 | B2 * | 11/2017 | Yu ............. H01L 29/66795 |
| 2005/0184311 | A1 | 8/2005 | Murthy et al. |

(Continued)

FOREIGN PATENT DOCUMENTS

| JP | 2012089841 | 5/2012 |
| KR | 101153154 | 6/2012 |

(Continued)

*Primary Examiner* — Herve-Louis Y Assouman
(74) *Attorney, Agent, or Firm* — Slater Matsil, LLP

(57) ABSTRACT

A method of forming a FinFET with a rounded source/drain profile comprises forming a fin in a substrate, etching a source/drain recess in the fin, forming a plurality of source/drain layers in the source/drain recess; and etching at least one of the plurality of source/drain layers. The source/drain layers may be a silicon germanium compound. Etching at the source/drain layers may comprises partially etching each of the plurality of source/drain layers prior to forming subsequent layers of the plurality of source/drain layers. The source/drain layers may be formed with a thickness at a top corner of about 15 nm, and the source/drain layers may each be etched back by about 3 nm prior to forming subsequent layers of the plurality of source/drain layers. Forming the plurality of source/drain layers optionally comprises forming at least five source/drain layers.

20 Claims, 8 Drawing Sheets

(56) References Cited

U.S. PATENT DOCUMENTS

| | | |
|---|---|---|
| 2005/0242395 A1 | 11/2005 | Chen et al. |
| 2006/0216897 A1 | 9/2006 | Lee et al. |
| 2007/0075372 A1 | 4/2007 | Terashima et al. |
| 2007/0090408 A1 | 4/2007 | Majumdar et al. |
| 2007/0235802 A1 | 10/2007 | Chong et al. |
| 2008/0057670 A1 | 3/2008 | Kim et al. |
| 2010/0015778 A1 | 1/2010 | Lin et al. |
| 2010/0233873 A1 | 9/2010 | Anderson et al. |
| 2010/0301350 A1 | 12/2010 | Tamura et al. |
| 2011/0027955 A1 | 2/2011 | Woon et al. |
| 2011/0068407 A1 | 3/2011 | Yeh et al. |
| 2011/0073952 A1 | 3/2011 | Kwok et al. |
| 2011/0079829 A1* | 4/2011 | Lai ................... H01L 29/41791 257/288 |
| 2011/0117732 A1 | 5/2011 | Bauer et al. |
| 2011/0147828 A1 | 6/2011 | Murthy et al. |
| 2011/0210404 A1 | 9/2011 | Su et al. |
| 2011/0260282 A1 | 10/2011 | Kawasaki |
| 2011/0287600 A1 | 11/2011 | Cheng et al. |

FOREIGN PATENT DOCUMENTS

| | | |
|---|---|---|
| KR | 20120086369 | 8/2012 |
| WO | 2011084262 | 7/2011 |

\* cited by examiner

FINFET WITH ROUNDED SOURCE/DRAIN PROFILE

PRIORITY

This application claims the benefit to and is a continuation of U.S. patent application Ser. No. 13/792,475, filed on Mar. 11, 2013, and entitled "FinFET with Rounded Source/Drain Profile," which application is incorporated herein by reference.

BACKGROUND

As modern integrated circuits shrink in size, the associated transistors shrink in size as well. In order to operate with predictable properties, transistor production focused initially on shrinking feature size of transistors. However, as the size of transistor features has approached atomic sizes, new transistor designs have been developed. Fin field effect transistors (FinFETs) are sometimes used to replace lateral metal oxide semiconductor field effect transistors (MOSFETs), enabling greater transistor packing density while maintaining predictable device performance.

Traditionally, a lateral transistor such as a MOSFET has a source and drain disposed in a semiconductor, with a gate disposed on the surface of the semiconductor between the source and drain. A FinFET has a channel region in a raised fin, with the gate insulator and gate contact covering one or more sides of the fin in a channel region. A source and drain may be formed on each side of the channel region.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the illustrative embodiments are discussed in detail below. It should be appreciated, however, that the present disclosure provides many applicable concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, forming source and drain regions in FinFET devices. The embodiments of the disclosure may also be applied, however, to a variety of semiconductor devices. Hereinafter, various embodiments will be explained in detail with reference to the accompanying drawings.

A FinFET device may be formed by doping a source and drain region in a semiconductor fin or by depositing a source and drain on opposite sides of a gated fin region. Silicon germanium (SiGe) may, in an embodiment, be used to grow the source/drain regions using an epitaxial growth process. However, since the FinFETs tend to be formed parallel to each other, growing SiGe source/drain regions may cause bridging between the source/drain regions in adjacent FinFETs. This issue is particularly pronounced when the fin pitch, or distance between adjacent fins, is reduced. The proximity of fins as the SiGe source/drain regions grow limits the size of the source/drain regions. Epitaxially grown SiGe tend to form a faceted crystalline shape, and a diamond shaped crystal in particular. The diamond shape exhibited by SiGe crystal grown creates corners at the top and on the sides of the source/drain regions in relation to the fin. The corners formed on the sides of the SiGe crystal tend to grow sideways, towards adjacent fin source/drain regions. It is these corners from adjacent fins that tend to join, bridging the source/drain region of adjacent SiGe crystals. In an embodiment, the SiGe source/drain regions may be grown in layers, with each SiGe layer etched to remove the corners of the SiGe layer, creating a rounded profile and permitting a greater height-to-width aspect ratio and finer fin pitch.

Figure 1:
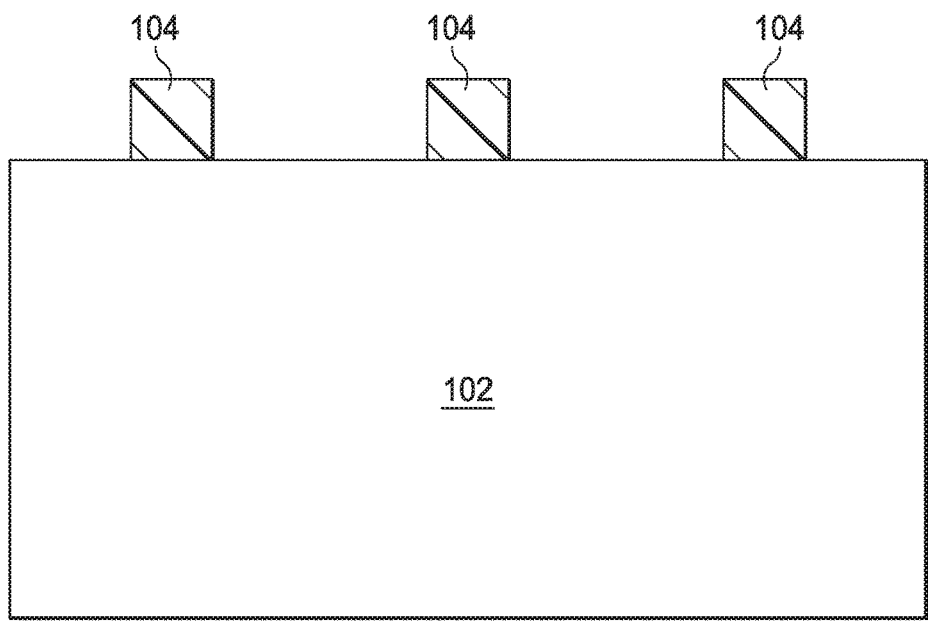
FIGS. 1-11 are cross-sectional views of FinFET device in intermediate steps of production according to an embodiment.

FIG. 1 is a cross-sectional view of an initial substrate 102 for creating fins. A mask 104 may be applied to a top surface of the substrate 102, with the mask defining where fins may be created. In the embodiment shown in FIG. 1, the mask is a positive mask, and the substrate 102 may be etched away through openings in the mask 104. In an embodiment, the substrate may be a semiconductor such as silicon, gallium arsenide, or the like. Additionally, the substrate 102 may be doped prior to mask 104 application. The mask 104 may be a hard mask such as a nitride or oxide, or may be another type of mask such as a spincoated photoresist. In one embodiment, the fin 202 pitch may be between about 38 nm and about 48 nm, which may be used, in an embodiment, in 10 nm to 16 nm FinFET fabrication processes. In another embodiment, the fin 202 pitch may be about 30 nm in a 7 nm FinFET fabrication process.

Figure 2:
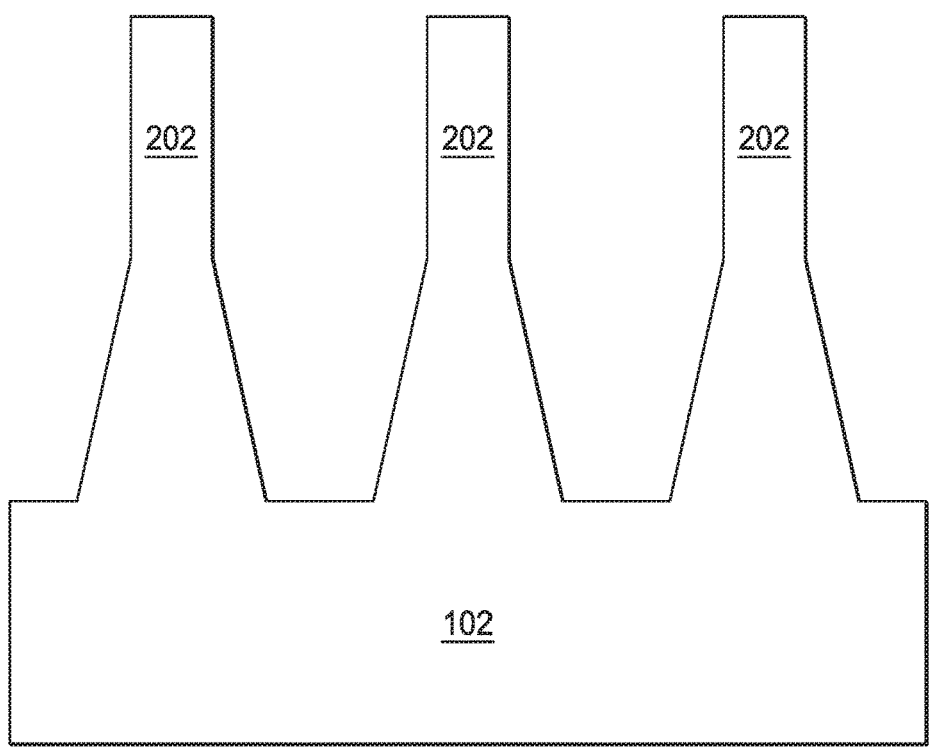

FIG. 2 is a cross-sectional view of fins 202 etched in a substrate 102. The substrate may be etched to remove material between the fins 202. In an embodiment, the mask 104 (FIG. 1) may be removed after etching. In another embodiment, the mask 104 may be a hard mask remaining on the fin 202, with a subsequent gate contact 302 (See FIG. 3) deposited over the mask 104.

Figure 3:
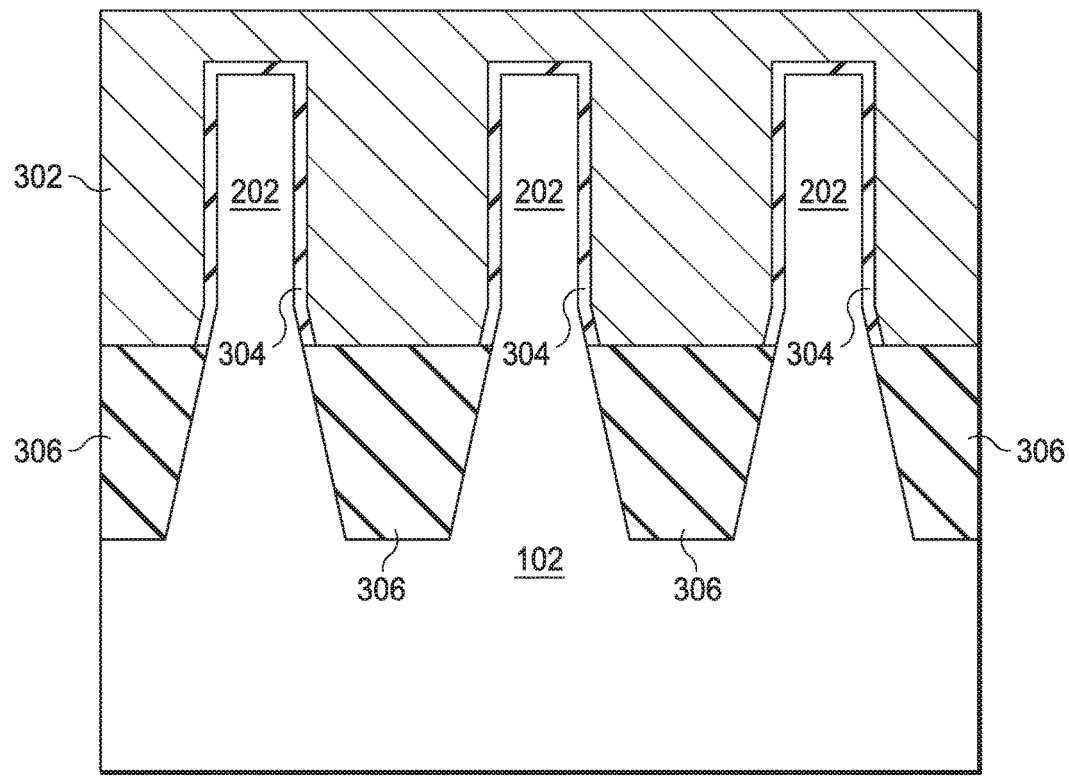
Figure 12A:
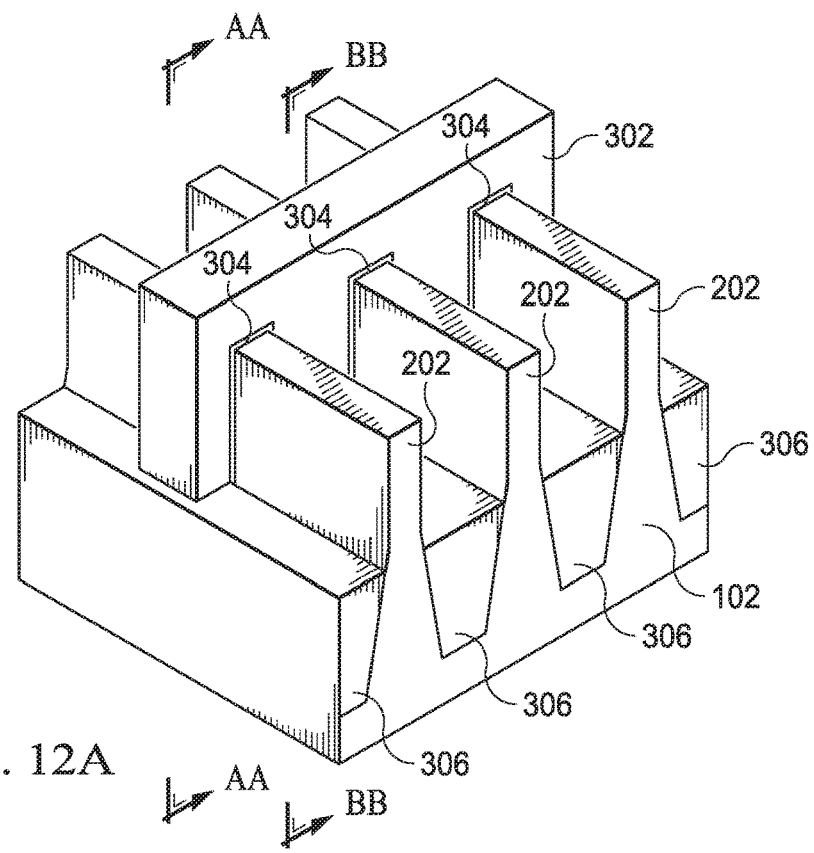
FIGS. 12A-12B are isometric views of FinFET device in intermediate steps of production according to an embodiment.

FIG. 3 is a cross-sectional view of formation of shallow trench isolation structures (STIs) 306 and a gate contact 302. FIG. 12A illustrates an isometric view of a gate contact 302 and insulating layer 304 (STIs omitted in FIG. 12A for clarity), with FIG. 3 being a cross-section along plane AA.

STIs 306 may be formed between the fins 202 in the etched spaced between the fins 202, formed as illustrated in FIG. 2, and then filling the etched trench with a dielectric such as an oxide. The fins 202 may be etched to have a depth greater than a final predetermined fin depth. For example, a predetermined fin height may be about 35 nm, yet the fins may be etched to a depth of about 60 nm or more, with the STI filling the bottom of the spaces between the fins 202 to a depth of about 20 nm or more.

A gate insulating layer 304 may be formed over a portion of the fins 202. In the illustrated embodiment, the insulating layer 304 is shown as formed over the fins 202 without being formed over the STIs 306. However, in another embodiment, the insulating layer 304 may be formed as a single continuous structure extending over multiple fins 202. Such an insulating layer 304 may be formed by growing an oxide on the surfaces of the fins 202, for example, by thermal oxidation, to create an oxide insulating layer 304. In another embodiment, the insulating layer may be a high-k material, nitride, or another insulator.

A gate contact 302 may be formed over the insulating layer 304. In the illustrated embodiment, the gate contact 302 is formed over multiple fins 202, however, in another embodiment, individual gate contacts may be formed over each fin, permitting individualized control of each gate.

Figure 4:
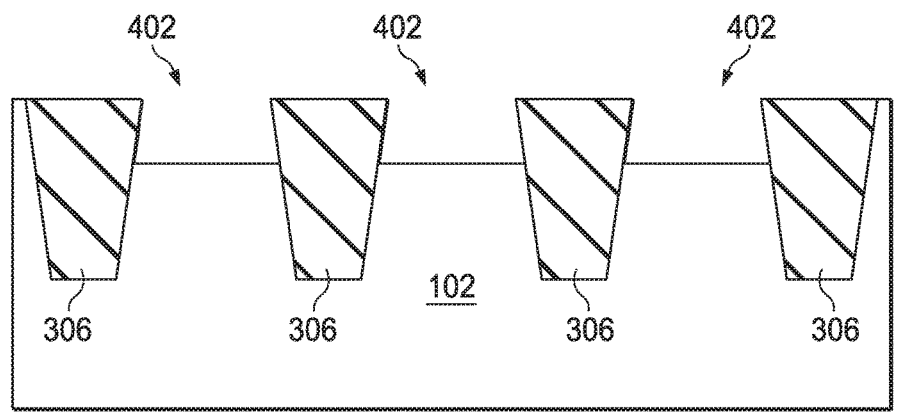
Figure 12B:
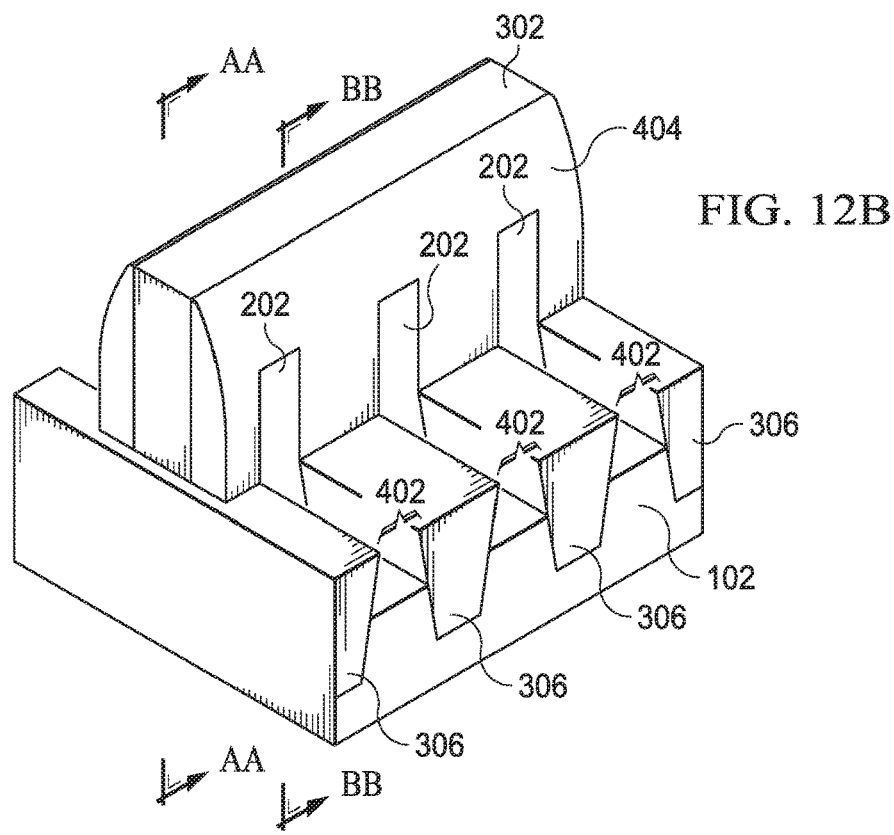

FIG. 4 shows a cross-sectional view of formation of source/drain recesses 402. FIG. 12B illustrates an isometric view of source, with FIG. 4 being a cross-section along plane BB. In an embodiment, the fins 202 (FIG. 3) are etched away, with the etching removing the substrate 102 below the surface of the STIs 306 to create source/drain recesses 402. In an embodiment, the source/drain recesses may be etched to a depth of about 55 nm below the topmost surface of the fins 202.

Figure 5:
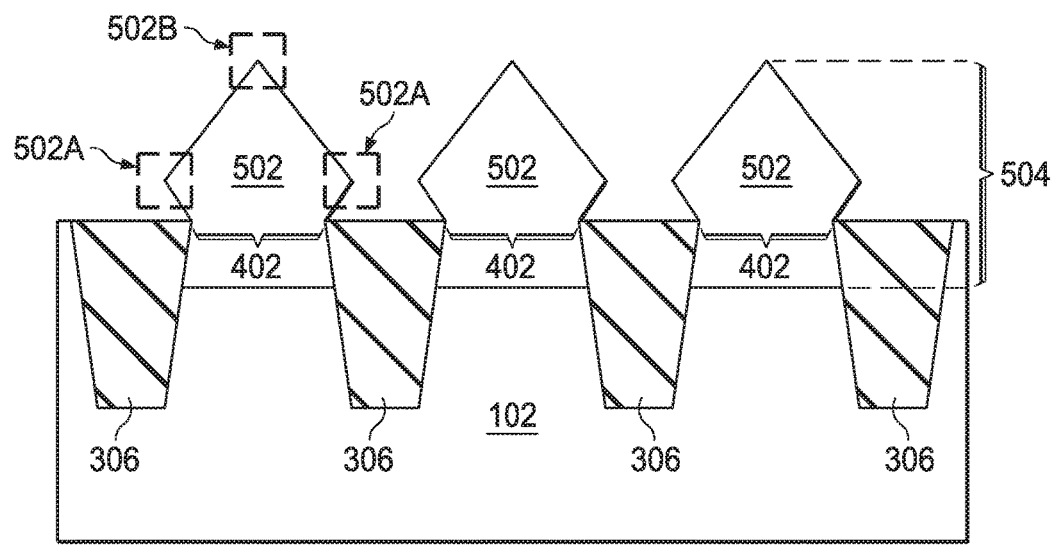

FIG. 5 shows a cross-sectional view of formation of a first source/drain layer 502 of a source/drain structure 504. A source and drain structure 504 may be formed on opposing sides of a gate contact 302 (FIG. 4). The first source/drain layer 502 may be grown to a height above the STIs 306 by a height of about 15 nm. In an embodiment, the source/drain structure 504 is grown from SiGe using an in-situ epitaxial growth process. In another embedment, the source/drain structure 504 may be formed of a doped SiGe compound, for example, by doping with boron, phosphorus, arsenic or a like material. The crystalline growth of SiGe results in side corners 502A and a top corner 502B. The crystalline structure causes the side corners 502A to have an angle of 109.6 degrees. However, SiGe crystals tend to grow with a constant aspect ratio, with the ratio of the height to the width remaining constant. Thus, as the first source/drain layer 502 grows, the source/drain structure 504 will widen as it grows. Growing the SiGe structures in stages, with the side corners 502A reduced by etching at each stage, prevents adjacent SiGe structures from bridging.

Figure 6:
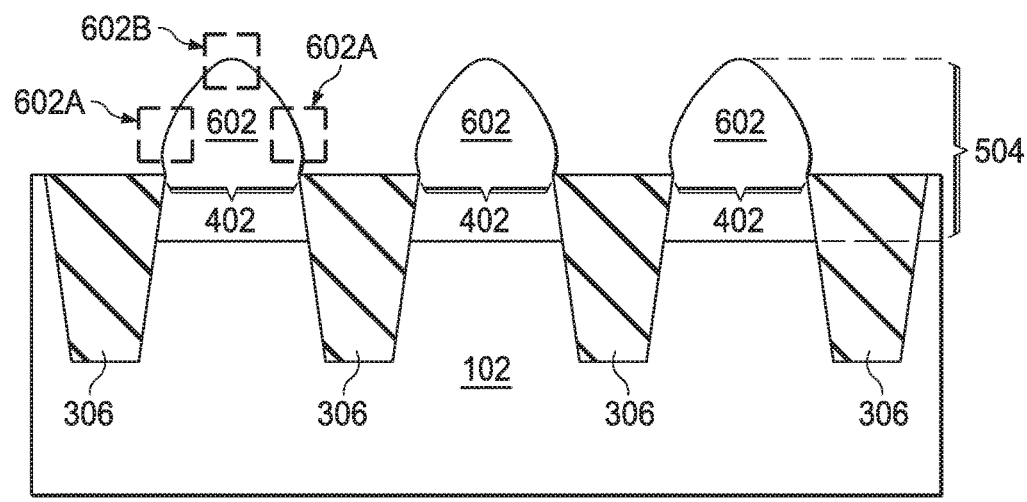

FIG. 6 shows a cross-sectional view of etch back of the source/drain structure 504. In an embodiment where the source/drain structures 504 are SiGe, the source/drain structures 504 may be selectively etched to modify the side corners 502A (FIG. 5) and top corner 502B (FIG. 5) to create rounded side corners 602A and rounded top corner 602B, resulting in a rounded first source/drain layer 602. Additionally, etching the SiGe source/drain structure 504 in its initial angular form tends to remove more material at the corners than on the flat portions due to the different ratios of surface area to volume. In an embodiment, the side corners 502A (FIG. 5) and top corner 502B (FIG. 5) of the first source/drain layer 502 (FIG. 5) may be etched back by about 3 nm, depending on the overall size of the source/drain structure 504. The etching may, in an embodiment, be performed using an HCl solution at a pressure between about 10 torr and about 30 torr.

Etching a PMOS device may be accomplished in an embodiment, by selective etching, while etching an NMOS device may be accomplished by masking and etching. Additionally, a PMOS device may be etched with HCl at a temperature between about 600° C. and about 700° C. while an NMOS device may be etched with HCl at a temperature between about 650° C. and about 700° C.

Figure 7:
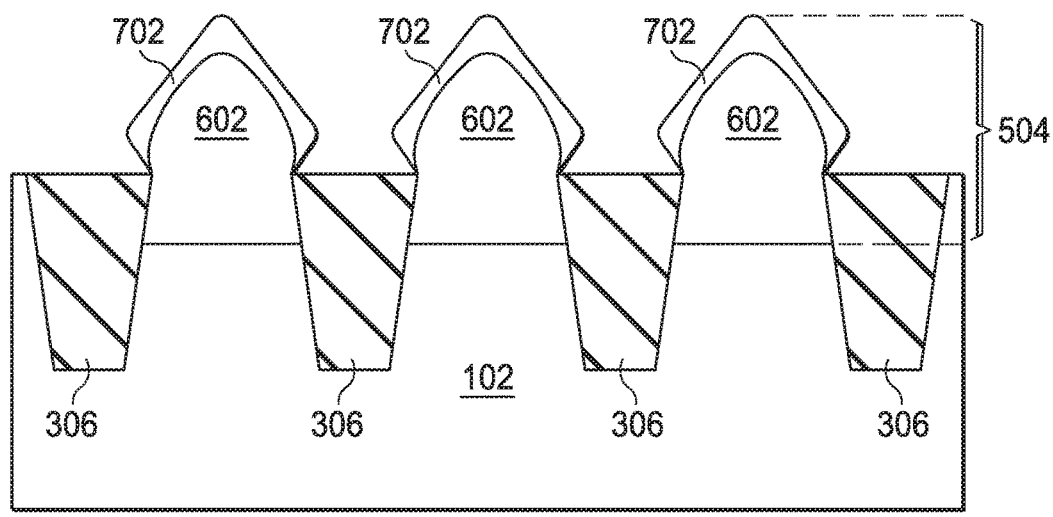
Figure 8:
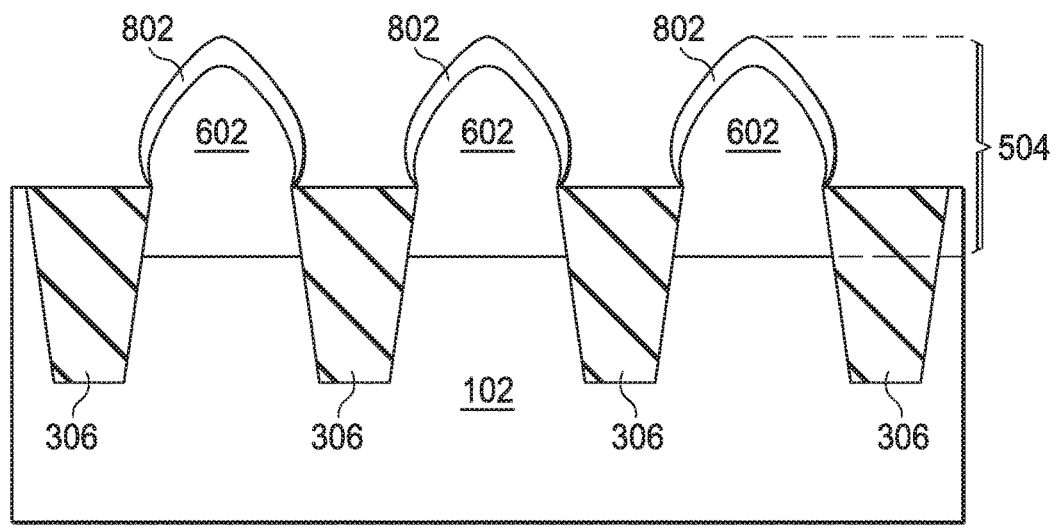

FIG. 7 illustrates formation of a second source/drain layer 702 and FIG. 8 is a cross sectional view of a forming a rounded second source/drain layer 802. In an embodiment, a second source/drain layer 702 of SiGe material may be epitaxially grown using a method similar to that used to grow the first source/drain layer 502 (FIG. 5). The rounded profile of the rounded first source/drain layer 602 causes the second source/drain layer 702 take on a slightly rounded profile at the corners. In an embodiment, the second source/drain layer 702 will be grown to a thickness where the corners do not achieve the full angular profile exhibited by monocrystalline SiGe structure.

The second source/drain layer 702 may be formed at a thickness of about 15 nm over the rounded first source/drain layer 602 at the top corner. The second source/drain layer 702 may be etched back to form a rounded second source/drain layer 802. In an embodiment, the second source/drain layer 702 may be etched back by about 3 nm at the top corner. Thus, the overall thickness at the corners of the rounded second source/drain layer 802 may be about 12 nm.

Figure 9:
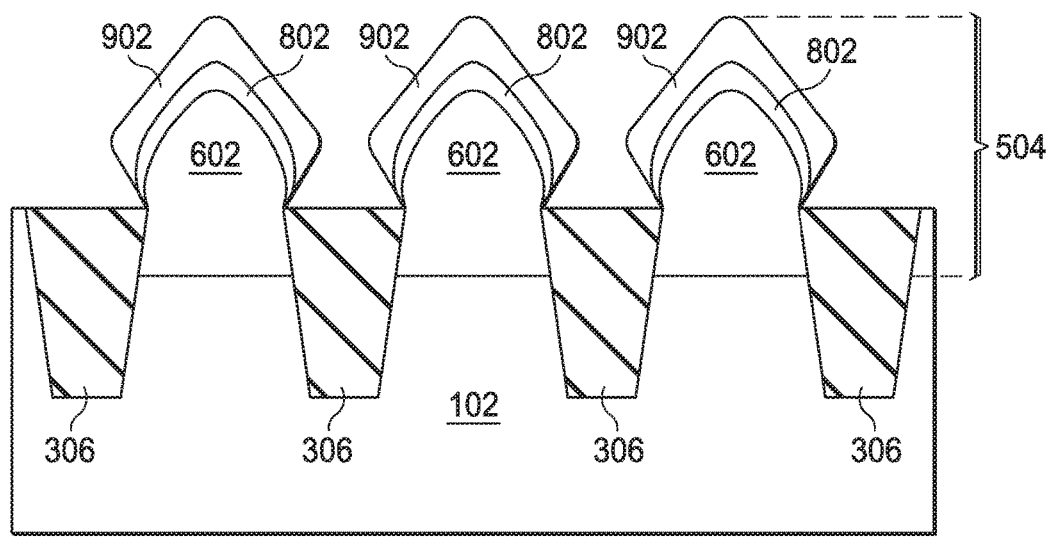
Figure 10:
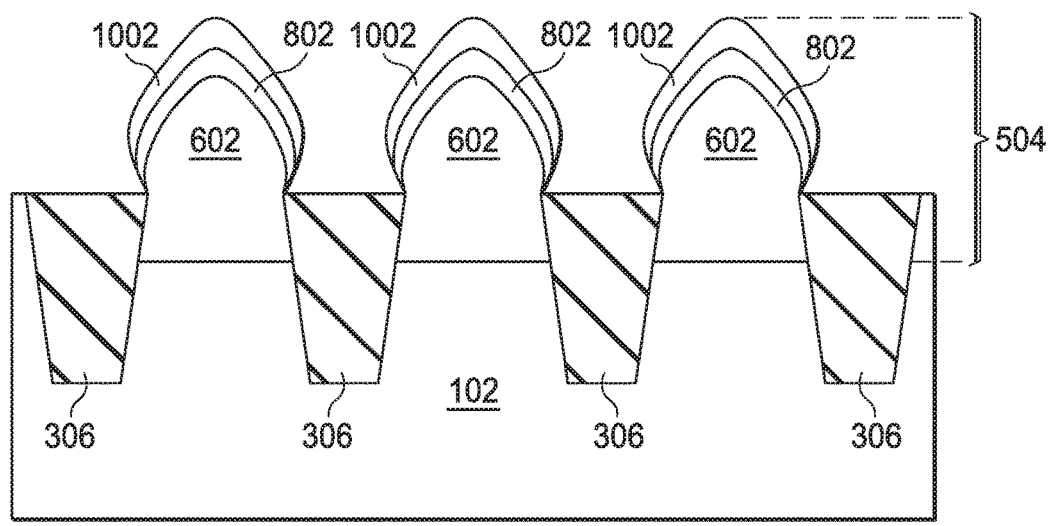

FIG. 9 illustrates formation of a third source/drain layer 902 and FIG. 10 is a cross sectional view of a forming a rounded third source/drain layer 1002. The third source/drain layer may be formed and etched back using a epitaxial growth method similar to the embodiments described above with respect to FIGS. 5-8. Subsequent layers may also be formed according to the processes described above.

Figure 11:
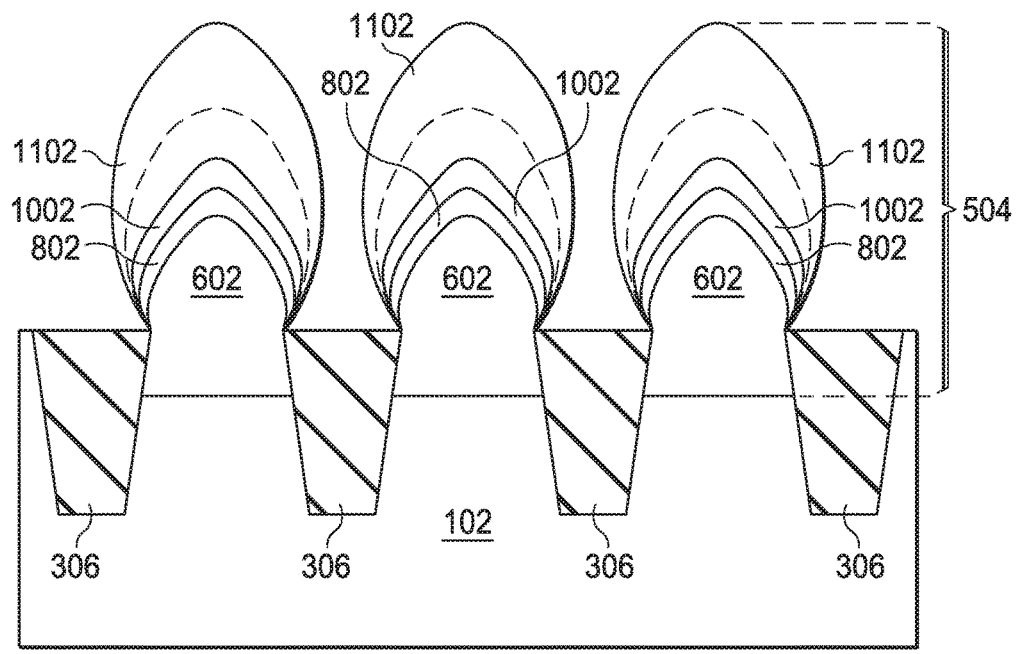

FIG. 11 illustrates formation of a top source/drain layer 1102. In an embodiment, the lower rounded source/drain layers 602, 802, 1002 while have achieved a rounded profile, and deposition of the top source/drain layer 1102 creates a rounded final, or top, layer. Such rounded profiles prior to the formation of the top source/drain layer 1102 will prevent bridging of adjacent top source/drain layers 1102, as the spacing between the adjacent lower layer 602, 802, 1002 permits formation of the top source/drain layer 1102 without bridging. In an embodiment, the top source/drain layer 1102 may be formed through epitaxial growth as described above, and may be formed without etching back the top source/drain layer 1102. While the top source/drain layer 1102 is illustrated in FIG. 11 as thicker than the other layers, it should be recognized that, depending on the height of the rounded source/drain structure 1104, the thickness of each layer may vary, and any number of layers may be formed, with the topmost source/drain layer being free from etching. In an embodiment, a device may be formed with five source/drain layers, including the top source/drain layer of source/drain. However, in another embodiment, the source/drain structure 1104 may have at least three layers.

Figure 13:
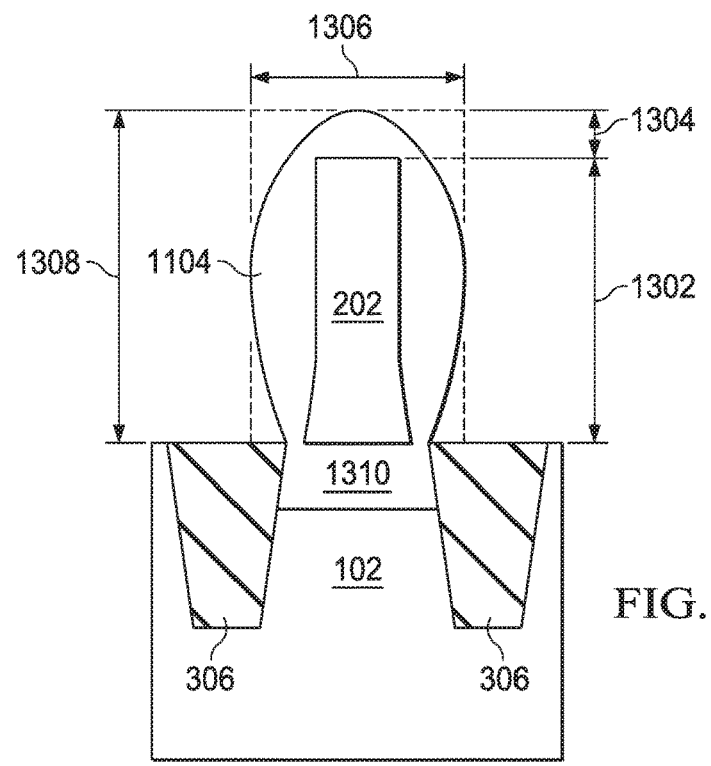
FIG. 13 is a cross-sectional view of a FinFET end region according to an embodiment.

FIG. 13 illustrates a cross-sectional view of a rounded source/drain structure 1104 at an end section of a FinFET according to an embodiment. The fin 202 is illustrated for clarity. For example, the fin 202 may have a fin height 1302 in the channel region under the gate contact 302 (see FIGS. 3, 12A). The rounded source/drain structure 1104 may extend above the entirety of the fin 202. The top corner, or peak, of the rounded source/drain structure 1104 may extend above the uppermost portion of the fin by a source/drain extension height 1304. Thus, the total height 1308 of the source/drain structure above the surface of the substrate 102 is the fin height 1302 plus the source/drain extension height 1304. In an embodiment, the rounded source/drain structure 1104 extends above the entirety of the fin 202 top surface. The rounded source/drain structure 1104 may have an upper portion extending above the top surface of the fin 202, and extending laterally beyond the edges of the top surface of the fin 202.

In an embodiment, the fin height 1302 may be about 35 nm, and the total height 1308 of the source/drain structure 1104 may be about 60 nm, and the width 1306 may be about 43 nm. Thus, a source/drain structure 1104 may have five layers each having a height of about 12 nm, resulting in an overall total height 1308 of about 60 nm. With spacing between adjacent source/drain structures of about 5 nm, the ratio of the width to the height, or aspect ratio, of a source/drain structure may be greater than about 0.75.

It should be appreciated that additional layers may be created on the source/drains structure 1104, permitting greater height while marginally increasing the width 1306 of the source/drain structure 1104. For example, in an embodiment, the fin pitch may be about 48 nm, and the source/drain structure 1104 may be an epitaxially grown SiGe structure with a height greater than about 55 nm. Additionally, a bottom portion 1310 of source/drain structure is grown within the source/drain recess 402, with the source/drains structure 1104 extending from below the top surface of the STIs 306 to above the top surface of the fins 202.

A SiGe source/drain structure grown as a single layer would generally start to bridge across adjacent fins at a source/drain structure height of about 45 nm due to the geometry of a single crystal SiGe source/drain structure. However growing the rounded SiGe drain/source structure 1104 in layers with etch back between layers forms a taller, narrower structure.

In an embodiment, the cross sectional area of the rounded source/drain structure 1104 may be greater than one-half (½), or even two-thirds (⅔) of the area of product of the rounded source/drain structure height 1308 and width 1306. Such cross-sectional fill above the top surface of the fin 202 results in less leakage current in the device and greater device performance.

Figure 14:
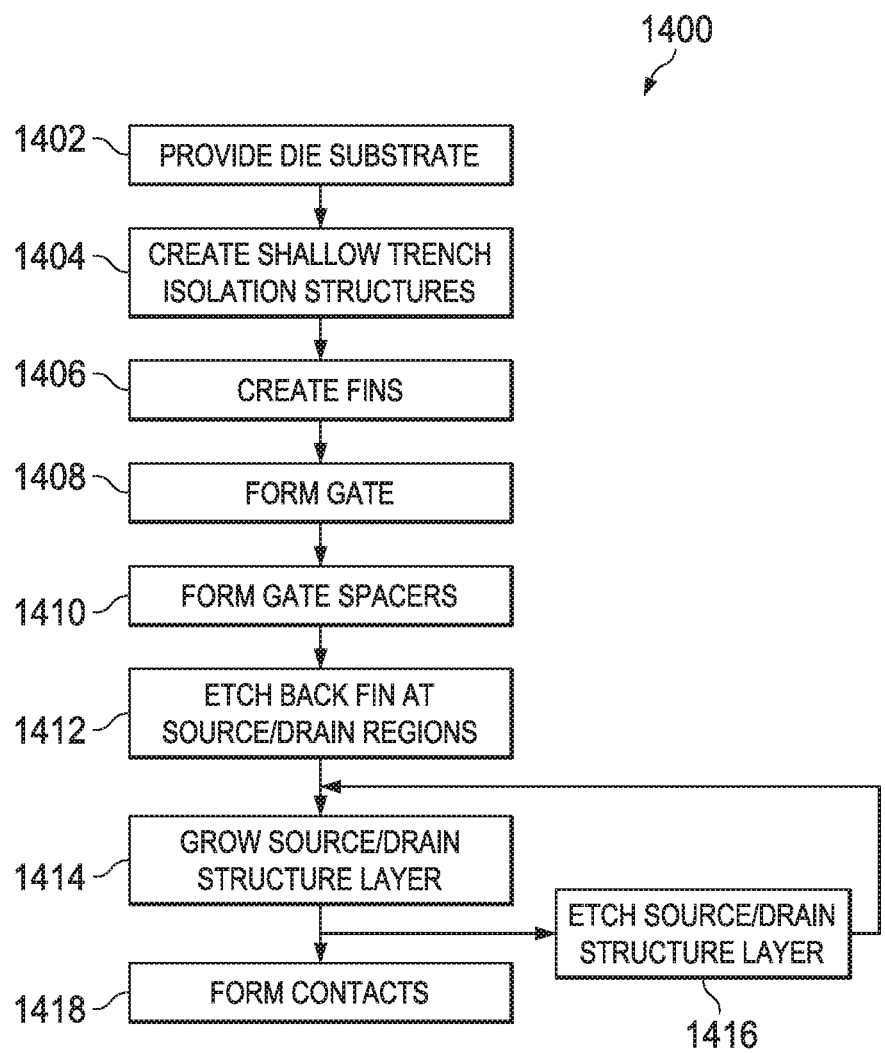
FIG. 14 is a flow chart of a method for forming a FinFET device according to an embodiment.

FIG. 14 is a flow chart of a method 1400 for forming a FinFET device according to an embodiment. A substrate is provided in block 1402, and STI structures 306 may optionally be formed in the substrate 102 in block 1404. One or more fins 202 may be formed in the substrate 102 in block 1406. The fins 202 may be formed by etching a substrate 102, or by, for example, forming the fins 202 through deposition, epitaxial growth, or the like. A gate structure comprising, for example, a gate contact 302 and a gate insulator 304 may be formed in block 1408. A gate spacer 404 may be formed in block 1410. The fins 202 may be etched back in the source/drain regions in block 1412. A source/drain layer may be grown in the etched back fin 202 source drain region in block 1414. The source/drain layer 502 may be etched back in block 1416. Subsequent source/drain layers 702, 902, 1102 may be formed over the first source/drain layer by repeating block 1414, with each additional source/drain layer 702, 902, 1102 optionally etched back, as in block 1416. One or more contacts to the source/drain structures 1104 may be formed in block 1418. In an embodiment, the source/drain structures 1104 may, for example, have a silicide formed thereon, and a metal contact formed over the silicide region.

While the steps described for the embodiment above are described in an order, it will be recognized that some steps may be performed in alternate orders without deviating from the principles of the embodiments herein.

Thus, in an embodiment a method of forming a FinFET with a rounded source/drain profile comprises forming a fin in a substrate, etching the fin back to create a source/drain recess, forming a plurality of source/drain layers in the source/drain recess, and etching at least one of the plurality of source/drain layers. The source/drain layers may be a silicon germanium compound. Etching at the source/drain layers may comprises partially etching each of the plurality of source/drain layers prior to forming subsequent layers of the plurality of source/drain layers. The source/drain layers may each be formed with a thickness at a top corner of about 15 nm, and the source/drain layers may be etched back by about 3 nm prior to forming subsequent layers of the plurality of source/drain layers. Forming the plurality of source/drain layers optionally comprises forming at least five source/drain layers. The fin may be formed as one of a plurality of fins, which may have a fin pitch of less than about 48 nm. Each of the plurality of source/drain structures may be formed with a cross sectional area of at least two-thirds of the area of a product of a height and a width of the source/drain structures, and optionally with a width to height ratio of at least 0.75.

A device according to an embodiment may comprise a fin disposed on a substrate, a gate structure disposed over the fin, and a source/drain structure disposed adjacent to the gate structure, with the source/drain structure having a rounded profile. A lower portion of each source/drain structure may be disposed in a recess between at least two shallow trench isolation (STI) structures. The source/drain structure may have at least five layers and source/drain structure comprises a top portion above a top surface of the fin, with the top portion extending laterally beyond edges of the top surface of the fin. The source/drain structure optionally has a width to a height ratio of at least 0.75 and may be a silicon germanium compound. The device may further comprise a STI disposed in the substrate below the fin, and the source/drain structure may extend at least 55 nm above the STI.

One general aspect of embodiments described herein includes a device, including: a fin disposed on a substrate, the fin including a source/drain recess, the source/drain recess having a bottom surface at a first height above the substrate, a channel region at a second height above the substrate, the second height being greater than the first height, and a step between the bottom surface of the source/drain recess and the channel region; a gate structure disposed over the fin; and a source/drain structure disposed adjacent to the gate structure and within the source/drain recess, the source/drain structure including a first epitaxial source/drain layer having a rounded profile, a second epitaxial source/drain layer overlying the first epitaxial source/drain layer, the second epitaxial source/drain layer having a rounded profile and a top epitaxial source/drain layer overlying the second epitaxial source/drain layer, a lower portion of each source/drain structure disposed in a recess between at least two shallow trench isolation (STI) structures.

Another general aspect of embodiments described herein includes a device, including: a first fin and a second fin respectively extending from a major surface of a substrate; the first fin including a source/drain recess in a first source/drain region, a first channel region and a step between the first channel region and a bottom of the source/drain recess; a plurality of source/drain layers in the source/drain recess; each of the plurality of source/drain layers having round corners; a topmost source/drain layer over the plurality of source/drain layers; a second plurality of source/drain layers adjacent a second channel region of the second fin; and a gate structure over and extending along sidewalls of the first fin and the second fin, where the plurality of source/drain layers is physically separated from the second plurality of source/drain layers.

Yet another general aspect of embodiments described herein includes a method of forming a device, including: forming a first fin and a second fin in a substrate; etching back the first fin to create a source/drain recess in a first source/drain region while leaving a first channel region of the first fin un-etched, thus forming a step between the un-etched channel region and a bottom of the source/drain recess; filling the source/drain recess with a sequence of source/drain layers in the source/drain recess where each source/drain layer of the sequence of source/drain layers is epitaxially grown with a faceted profile and then etched to at least partially round corners of the faceted profile before a next source/drain layer of the sequence of source/drain layers is epitaxially grown; and epitaxially growing a topmost source/drain layer over the sequence of source/drain layers.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device, comprising:
   a fin disposed on a substrate, the fin including a source/drain recess, the source/drain recess having a bottom surface at a first height above the substrate, a channel region at a second height above the substrate, the second height being greater than the first height, and a step between the bottom surface of the source/drain recess and the channel region;
   a gate structure disposed over the fin; and
   a source/drain structure disposed adjacent to the gate structure and within the source/drain recess, the source/drain structure including a first epitaxial source/drain layer having a rounded profile, a second epitaxial source/drain layer overlying the first epitaxial source/drain layer, the second epitaxial source/drain layer having a rounded profile and a top epitaxial source/drain layer overlying the second epitaxial source/drain layer, a lower portion of each source/drain structure disposed in a recess between at least two shallow trench isolation (STI) structures.

2. The device of claim 1, wherein the source/drain structure has at least five layers.

3. The device of claim 1, wherein the source/drain structure comprises a top portion above a top surface of the fin, the top portion extending laterally beyond edges of the top surface of the fin.

4. The device of claim 3, wherein the source/drain structure has a width to a height ratio of at least 0.75.

5. The device of claim 1, wherein the source/drain structure is a silicon germanium compound.

6. The device of claim 1, further comprising at least two STI structures disposed in the substrate below the fin, wherein the source/drain structure extends at least 55 nm above the at least two STI structures.

7. The device of claim 1, further comprising a plurality of fins, wherein the fins are spaced with a pitch of less than about 48 nm.

8. The device of claim 1, wherein the source/drain structure has a width to height ratio of at least 0.75.

9. A device, comprising:
   a first fin and a second fin respectively extending from a major surface of a substrate;
   the first fin including a source/drain recess in a first source/drain region, a first channel region and a step between the first channel region and a bottom of the source/drain recess;
   a plurality of source/drain layers in the source/drain recess;
   each of the plurality of source/drain layers having round corners;
   a topmost source/drain layer over the plurality of source/drain layers;
   a second plurality of source/drain layers adjacent a second channel region of the second fin; and
   a gate structure over and extending along sidewalls of the first fin and the second fin, wherein the plurality of source/drain layers is physically separated from the second plurality of source/drain layers.

10. The device of claim 9, further comprising an isolation layer between the first fin and the second fin.

11. The device of claim 9, further comprising a continuous gate insulating layer formed over the first fin and the second fin.

12. The device of claim 9 wherein the plurality of source/drain layers includes at least five layers.

13. The device of claim 9, wherein the topmost source/drain layer is thicker than a source/drain layer of the plurality of source/drain layers.

14. The device of claim 9, wherein a thickness of each source/drain layer of the plurality of source/drain layers is greater than a thickness of an immediately adjacent source/drain layer of the plurality of source/drain layers.

15. The device of claim 9, wherein a respective thickness of a source/drain layer of the plurality of source/drain layers increases from a bottommost source/drain layer of the plurality of source/drain layers to a topmost source/drain layer of the plurality of source/drain layers.

16. A device comprising:
   a first fin and a second fin respectively extending form a substrate;
   the first fin having a source/drain recess in a first source/drain region, a first channel region, and a step between the first channel region and a bottom of the source/drain recess;
   the source/drain recess being filled with a sequence of source/drain layers in the source/drain recess wherein each source/drain layer of the sequence of source/drain layers has at least partially round corners; and
   a topmost source/drain layer over the sequence of source/drain layers.

17. The device of claim 16, wherein the sequence of source/drain layers comprises epitaxial SiGe layers.

18. The device of claim 16, where each source/drain layer of the sequence of source/drain layers is physically spaced apart from an adjacent source/drain structure in the second fin.

19. The device of claim 16, wherein the topmost source/drain layer extends at least 55 nm above an isolation structure that extends between the first fin and the second fin.

20. The device of claim 16, wherein a respective thickness of each source/drain layer of the sequence of source/drain layers increases from a bottommost source/drain layer of the sequence of source/drain layers to a topmost source/drain layer of the sequence of source/drain layers.

* * * * *